US006050332A

United States Patent [19]

Smith et al.

[11] Patent Number: 6,050,332

[45] Date of Patent: Apr. 18, 2000

[54] EXTRUDED, TIERED HIGH FIN DENSITY HEAT SINKS AND METHOD OF MANUFACTURE

[75] Inventors: Dean L. Smith, Pittsford; Edmund J. Sobresky, Batavia; Roger S. Kerr, Brockport, all of N.Y.

[73] Assignee: Eastman Kodak Company, Rochester, N.Y.

[21] Appl. No.: 09/365,382

[22] Filed: Aug. 2, 1999

Related U.S. Application Data

[62] Division of application No. 08/988,804, Dec. 11, 1997, Pat. No. 6,009,938.

[51] Int. Cl.[7] .......... F28F 7/00

[52] U.S. Cl. .......... 165/185; 165/80.3; 174/16.3; 361/703; 257/722

[58] Field of Search .......... 165/80.3, 80.4, 165/104.33, 185; 361/697, 703; 174/16.3; 257/722

[56] References Cited

U.S. PATENT DOCUMENTS

| | | | |
|---|---|---|---|
| 5,787,976 | 8/1998 | Hamburgen et al. | 165/185 |
| 5,912,802 | 6/1999 | Nelson | 165/185 |
| 5,988,266 | 11/1999 | Smith et al. | 165/185 |
| 5,992,511 | 11/1999 | Kodaira et al. | 165/185 X |

*Primary Examiner*—Christopher Atkinson
*Attorney, Agent, or Firm*—Clyde E. Bailey, Sr.

[57] ABSTRACT

An extruded, tiered high fin density heat sink (10) uses extruded first base, second base and bridging elements (12, 16, 14) having an arrangement of closely spaced, parallel fins (20, 26, 32, 38) and recesses (22, 28, 34, 40) for receiving opposing fins in the elements. The fins (20, 38) in the first and second base elements (12, 16) are bonded to recesses (28, 34) in opposite common faces (24, 30) of bridging elements (14) while fins (26, 32) extending from both opposing faces (24, 30) of bridging element (14) are bonded in aligned recesses (22, 40) in the first and second base element (12, 16) forming an extruded, tiered, high fin density heat sink (10).

1 Claim, 12 Drawing Sheets

EXTRUDED, TIERED HIGH FIN DENSITY HEAT SINKS AND METHOD OF MANUFACTURE

CROSS REFERENCE TO RELATED APPLICATION

This is a Divisional of U.S. Ser. No. 08/988,804, filed Dec. 11, 1997, now U.S. Pat. No. 6,009,938, entitled, "EXTRUDED, TIERED HIGH FIN DENSITY HEAT SINKS AND METHOD OF MANUFACTURE."

FIELD OF THE INVENTION

The invention relates to heat sinks, more particularly, the invention concerns extruded, bonded tiered heat sinks having a high fin density, which enables superior thermal performance in a limited space.

BACKGROUND OF THE INVENTION

Existing high performance heat sinks are characterized by a high fin density design, i.e., a fin population about twice that which can be normally produced in a standard production process. In this case, the surface area has a major influence on the overall heat transfer capability of the heat sink. Additionally for existing heat sinks having tightly spaced fins, the heat transfer coefficient is determined by the hydraulic diameter of the heat sink design. Hydraulic diameter is generally defined in the art as four times the area of the channel (i.e., space or distance between adjacent fins) divided by the perimeter of the channel. Thus, the smaller the hydraulic diameter, the higher both the heat transfer coefficient and the heat transfer of the heat sink.

One such design is illustrated in U.S. Pat. No. 4,777,560 by Herrell et al in which a high performance, high fin density heat sink is described. According to Herrell et al., various alternative heat sink construction techniques are described that produce high fin density design. An inherent disadvantage of the design is the inability to maximize the surface area of each individual fin. Approximately 25% to 33% of the potential individual fin surface area is not available, as this area is in contact with the adjacent fin (See for instance Herrell et al, FIGS. 1, 2, 3 and 4). In addition, heat sinks based on FIGS. 1 and 2 in Herrell et al have an internal plenum that further decreases available surface area for a given volume of a heat sink design. Thus, Herrell et al do not teach maximizing heat sink surface area, for a given heat sink volume.

In U.S. Pat. No. 5,304,846 to Azar et al, a heat sink design is disclosed that maximizes fin surface area in a high performance, high fin density heat sink. According to Azar et al., the manufacturing techniques disclosed are crystal-orientation-dependent etching, precision sawing, electric discharge machining, or numerically controlled machining. A major shortcoming of the Azar et. al. heat sink design is that they are generally difficult to manufacture. Additionally, the Azar et. al. heat sink requires enormously high production cycle time to manufacture which, of course, makes them cost ineffective.

In U.S. Pat. No. 4,884,331 by Hinshaw, a method of manufacturing a pin-finned heat sink from an extrusion is described. According to the cross cut machine method disclosed in Hinshaw, the maximum pin fin density that can be achieved is limited to what is obtainable by an extrusion process. This latter limitation clearly would not be acceptable in the heat sink design of the present invention. Another shortcoming of Hinshaw is that only square or rectangular pin fins can be manufactured, no round or elliptical profiles are available Moreover, there exists various heat sink manufacturers that offer bonded fin heat sink assemblies in which each fin in the assembly is individually bonded into a heat sink base. (See for instance, catalogue material on Augmented surface Bonded Heat Sinks published by AAVID™ Thermal Technologies, Inc. (March 1996). A major shortcoming, however of the AAVID™ heat sinks is there enormously high cost. This cost is related directly to the labor required to individually arrange each fin on some sort of support or substrate and high production cycle time.

Commonly owned U.S. patent applications, Ser. Nos. 08/959,692, filed Oct. 29, 1997 and D.76,236, hereby incorporated herein by reference, disclose cost effective techniques, based upon dual extruded or dual cast heat sinks, to manufacture high fin density heat sinks. In brief, upper and lower heat sink elements described in these patent applications are combined together, with the lower fins being bonded into the upper recesses and the upper fins being bonded to the lower recesses. In these cases, due to the extrusion and die cast tooling limitations, the fin height to thickness ratio typically cannot exceed 10:1 for tightly packed fins. High fin density heat sink applications that require taller fins cannot be met with this dual extruded and bonded technique.

Therefore, a need persists for a high performance, high fin density, extruded, tiered heat sink with a high fin to thickness ratio, that maximizes heat sink surface area and is cost effective and simple to manufacture.

SUMMARY OF THE INVENTION

It is, therefore, an object of the invention to provide an extruded, heat sink which has a high fin density and a plurality of fluid flow channels defined by narrow passageways between nearest adjacent fins in tiered elements.

Yet another object of the invention is to provide a method of manufacturing an extruded, tiered heat sink with bonded elements enabling greater structural integrity.

Still another object of the invention is to provide a method of manufacturing a high performance, high fin density heat sink that is cost effective.

Yet another object of the invention is to provide a tiered heat sink that provides a plurality of integral ducts or fluid flow channels that insures that all air flow from a heat generating body goes through the heat sink with no air by-pass.

Still further it is another object of the invention to provide multiple mounting locations for the attachment of heat generating sources.

To overcome one of more problems in the prior art, there is provided, in one aspect of the invention, an extruded, tiered high fin density heat sink which includes an extruded first base element having a plurality of parallel first fins extending outwardly from a common first face with nearest adjacent first fins having a first recess formed therebetween in the common first face. Also included in the heat sink of the invention is an extruded second base element having a plurality of parallel second fins extending outwardly from a common second face with nearest adjacent second fins having a second recess formed therebetween in the common second face.

In addition to extruded first and second base elements, the heat sink of the invention includes an extruded bridging element having a third common face and an opposing fourth common face. According to our invention, third common face has a plurality of parallel third fins extending outwardly from the third common face with nearest adjacent third fins having a third recess formed therebetween in the common third face. Likewise, fourth common face of the bridging element has a plurality of parallel fourth fins extending outwardly from the fourth common face with nearest adjacent fourth fins having a fourth recess formed in the common fourth face.

In a preferred embodiment of the invention, the bridging element is arranged between the first and second base elements in a manner such that an end edge portion of each of the first fins is fixedly bonded in an opposing third recess in the bridging element. Further, an end edge portion of each of the third fins is fixedly bonded in an opposing first recess of the first base element thereby forming a plurality of fluid passageways between the first and third fins. Moreover, an end edge portion of each of the second fins of the second base elements is fixed in a fourth recess of the bridging element. To securely join the two elements, an end edge portion of each of the fourth fins of the bridging element is fixedly bonded in a second recess of the second base element thereby forming a plurality of fluid passageways between nearest adjacent second and fourth fins.

In another aspect of the invention, a method of manufacturing an extruded, tiered high fin density heat sink includes the steps of: providing an extrusion die for extruding metallic billets into a first base element, a second base element and a bridging element: and, extruding the first base element, the second base element and the bridging element, each as described above. Each of the extruded elements are sized to a predetermined dimension depending on the desired application. The common first face of the first base element is aligned with the common third face of the bridging element so that each one of the first fins is properly aligned for direct insertion into a third recess and each one of the third fins is aligned for direct insertion into a first recess of the first base element. In a similar manner, the common second face of the second base element is aligned with the common fourth face of the bridging element so that each one of the second fins is aligned for direct insertion into a fourth recess of the bridging element and each one of said fourth fins is aligned for direct insertion into a second recess of the second base element. A bonding layer or resin is then applied to end edge portions the fins and the fins are pressed into their respective recesses as indicated above, thereby forming an extruded heat sink having gas passageways defined by spacing between nearest adjacent bonded fins in the first base element (defining one tier) and bridging element as well as between nearest adjacent bonded fins in the second base element and the bridging element (defining another tier).

It is, therefore, an advantageous effect of the invention that a high thermally efficient heat sink formed by extruding and bonding together the first base, second base and bridge elements is cost effective and efficiently manufactured. Also the heat sink of the invention has the added advantage of having increased structural integrity and therefore is adaptable to more applications.

BRIEF DESCRIPTION OF THE DRAWINGS

The foregoing as well as other objects, features and advantages of this invention will become more apparent from the appended Figures, wherein like reference numerals denote like elements, and wherein.

DETAILED DESCRIPTION OF THE INVENTION

Figure 1:
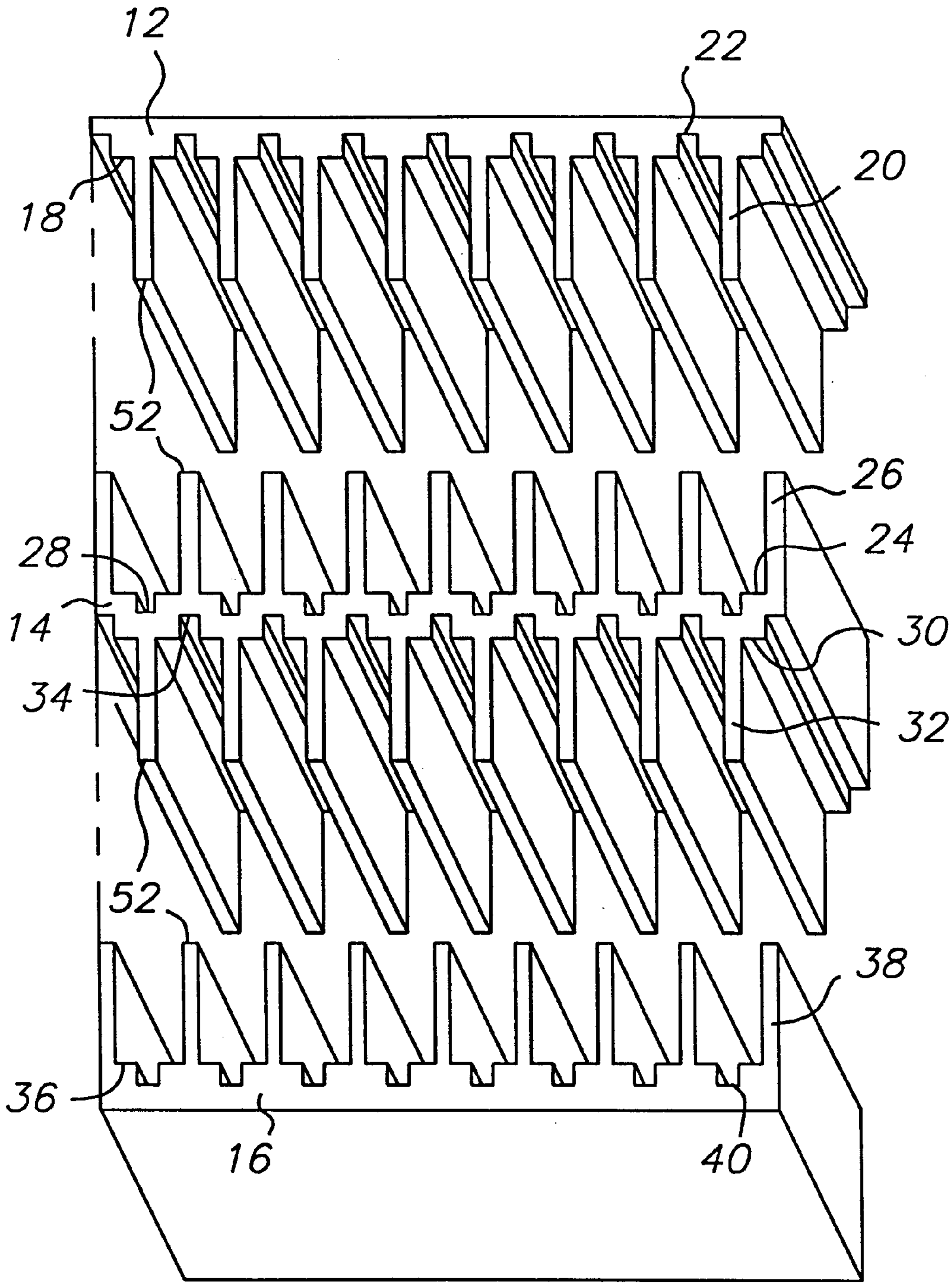
FIGS. 1 and 2 are exploded schematic views of the heat sink of the invention illustrating the three extruded elements from different orientations.

Turning now to the drawings, and more particular to FIGS. 1–7, there is illustrated the extruded, high fin density heat sink 10 manufactured in accordance with the principles of the invention. More particularly, heat sink 10 includes extruded first and second base elements 12, 16 and bridging element 14. As best seen in FIG. 1, extruded first base element 12 has a common first face 18 that accommodates a plurality of vertically extending, substantially parallel, spaced first fins 20. Between nearest adjacent spaced first fins 20 is formed a first recess channel 22 which extends lengthwise between the adjacent first fins 20.

Figure 2:
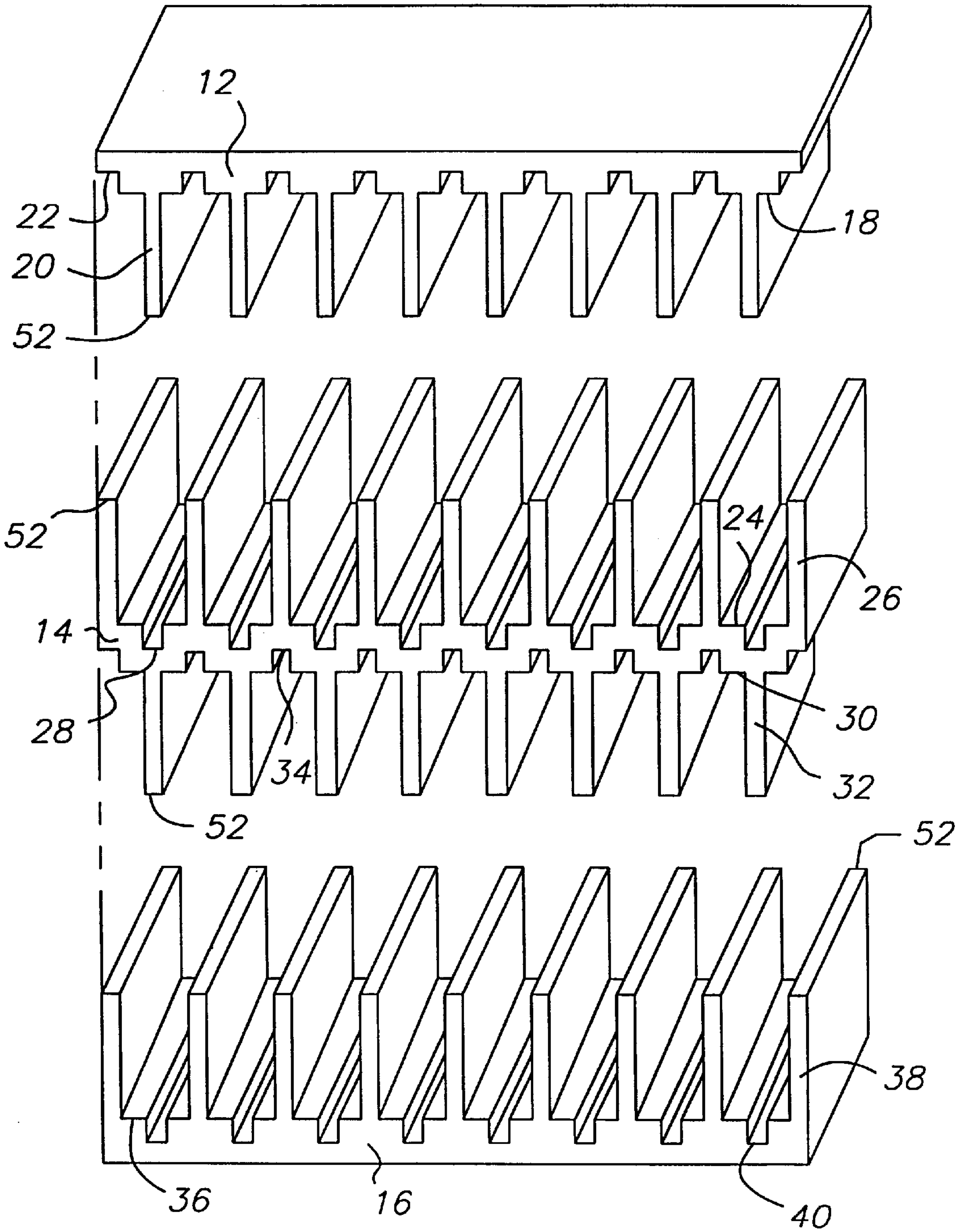

Similarly, as best seen in FIG. 2, extruded bridge element 14 includes a common third face 24 that accommodates a plurality of vertically extending, substantially parallel, spaced third fins 26. Further, one of a plurality of similar third recesses 28 is formed in the common third face 24 between adjacent third fins 26.

Similarly, as best seen in FIG. 1, extruded bridging element 14 includes a common fourth face 30 opposite common third face 24. Common fourth face 30 has a plurality of vertically extending, substantially parallel, spaced fourth fins 32. Moreover, a plurality of similar fourth recesses 34 is formed in the common fourth face 30 between adjacent fourth fins 32.

Depicted in FIG. 2, common second face 36 of second base element 16 arranged opposite common fourth face 30 of bridging element 14 has a plurality of vertically extending, substantially parallel, spaced second fins 38. Between nearest adjacent spaced second fins 38 is formed a second recess 40 in the common second face 36 which extends between adjacent second fins 38. Skilled artisans will appreciate that multiple or partial bridging elements may be used to construct a heat sink having a desired number of tiers.

Figure 3:
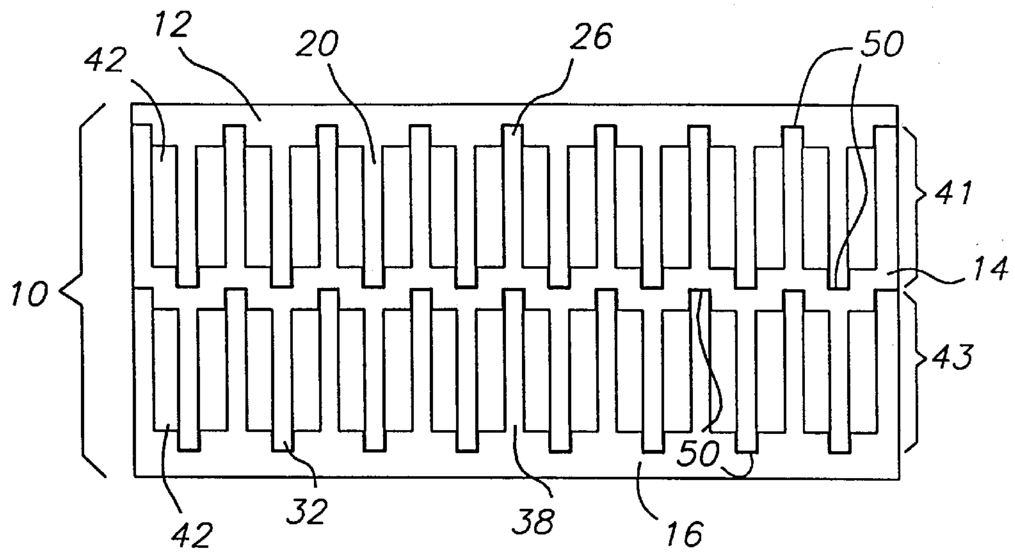
FIG. 3 is a front view of heat sink elements showing the fins and recessed channels that are used to position and bond the fins into the opposed element.

Illustrated in FIG. 3, one tier 41 of heat sink 10 has a plurality of fluid flow passageways 42 formed between nearest adjacent first and third fins 20, 26 in the bonded first base element 12 and the bridging elements 14. Likewise, another tier 43 of heat sink 10 has a plurality of fluid flow passageways 42 formed between nearest adjacent second and fourth fins 8, 2 in the bonded second base element 16 and bridging element 14 of heat sink 10. Fluid flow passageways 42 in both tiers 41, 43 enable fluid, such as heat from a heat generating body (not shown) to pass through the heat sink 10 during thermal cooling.

According to another embodiment of the invention, a method of manufacturing an extruded high fin density heat sink 10, as described above, includes the step of providing an extrusion die (not shown) for extruding billets for forming first and second base 12, 16 and bridging element 14. We prefer using a hot extrusion process using typical operating conditions, i.e., temperature and pressure, corresponding to the stock or materials being extruded. Billets formed during the extrusion process are then transformed during successive steps (described below) into a first base element 12, a second base element 16 and a bridging element 14.

First and second base elements 12, 16 and bridging element 14 may be extruded from a variety of commercially available thermally conductive nonferrous stock or materials, for instance, zinc alloys, copper, copper alloys, magnesium, aluminum, and a mixture thereof. For instance, the following are approximate temperature ranges for some stock materials that may be used in the method of the invention: aluminum, 1000–1100 degrees F; copper, 1200–2000 degrees F. In our preferred embodiment we used copper alloys which has the advantage of high thermal conductivity.

Typically, extrusion dies of the type used to form first and second base elements 12, 16 and bridging element 14 are made of hardened H-13 tool steel. The shape and size of the base elements, as described, are wire electro discharge machining cut into the die. Detailed features of the first and second base elements 12, 16 and bridging element 14 are sized in accordance with known shrinkage parameters and with an angular relief cut into the backside of the die to facilitate the extrusion process. The extrusion die is configured, along with a back-up die, to fit into a conventional extrusion press of suitable tonnage for the size and weight of the base element. Thus, preferably heat sink 10 having generally first and second base elements 12, 16 and bridging element 14 with a plurality of substantially parallel first, second, third and fourth fins 20, 38, 26, 32 (as discussed above) extending from a respective common face 18, 36, 24, 30 is extruded by employing an extrusion die (as described) and an extrusion press of suitable size and tonnage.

Important detail features of the first and second base elements 12, 16, and bridging element 14 include the thickness of the fins and spacing between nearest adjacent fins in each element. Also important are the plurality of spacings between nearest adjacent first and third fins 20, 26 in the bonded first base element 12 and bridging element 14 and the plurality of spacings between nearest adjacent fourth and second fins 32, 38 in the bonded bridging element 14 and the second base element 16. In part, this latter feature is determined by the strength of the die materials and extrudeability of the alloy selected for extrusion. For common aluminum 6061 and 6063 alloys, we prefer a ratio of fin thickness to fin height of about 1/10 where the fin thickness is about 0.050 inches (1.27 mm) at the tip or top end portion that is inserted in the recess in the opposing common face. Preferably, the spacing is about 3½ to 4 times the thickness of the fins. We have found that fins 20, 26, 32, 38 should have taper for maximum produceability, about 1/5 the fin thickness at the tip per side. The practical limit for fin thickness is about 0.050 inches at the tip.

Moreover, the first and second base elements 12, 16 and bridging element 14 of heat sink 10, having our preferred dimensions and features (described above), are then extruded from the extrusion die. The first and second base elements 12, 16 and bridging element 14 after having been extruded, are then assembled in accordance with the steps of the invention, further discussed below.

Skilled artisans will appreciate that the extrusion process (not illustrated), described in greater details below, itself is the culmination of a series of pre-planned and scheduled functions. Billets of the alloy used for the first and second base elements 12, 16 and bridging element 14 are purchased from one of a large variety of vendors, such as Alcan, Shawinigan, Quebec. The billets may be cut from longer logs of stock material or manufactured to specification, i.e., to the proper size, by the extruders. As is well know in the art, extrusion presses range from 50 tons to 8,000 tons. Billets can be from 2 inches in diameter to 24 inches in diameter. Billets are preheated to approximately 1000 deg. F, depending on the material to be extruded, and then fed into the container of the extrusion press. Prior to preheat, however, the extrusion die and back-up die are preferably preheated and placed ahead of the container in the die ring that holds the die and the die back-up block.

During the extrusion process (not illustrated), a ram, with dummy block in front, advances the billet against the extrusion die. Because this is a closed container under high pressure, the hot aluminum metal will be extruded out through the die opening resulting in a length of extrusion the shape of the preferred extrusion die.

As will be appreciated by those skilled in the art, as the extrusion emerges from the die, an operator, sometimes referred to as a puller, will grasp the end of the extrusion and exert a degree of tension on the extrusion to keep it straight as it travels down the length of the run out table (a series of graphite blocks that guide the extrusion). The length of the extrusion is determined by the length of the run out table or the ratio of the volume of the extrusion to the volume of the billet. At this length, the extrusion is cut and then allowed to cool to room temperature on the run out table.

The ram (not shown) will stop short of the die by about 3 inches creating a butt or unextruded billet. At this point the container and ram back off from the unextruded billet which is then sheared off for further processing. The container is moved forward, another billet is loaded into the container and the process begins again.

Subsequently, after the lengths of extruded material are cooled, they are transferred to a stretcher where each end is grasped and the length is stretched up to 3% thereby minimizing the volumetric stresses and distortions in the extruded material. The lengths are then cut using cutoff saws to processing size lengths that can readily be further processed, including heat treatments, or cut to intermediate or final dimensional size.

After extruding, the first and second base elements 12, 16 and the bridging element 14 are then independently sized to a predetermined dimension to accommodate a particular application. Dimensionally sizing the first and second base elements 12, 16 and bridging element 14 elements can be accomplished with any conventional means such as grinding, machining, etc. Once the first and second base elements 12, 16 and bridging element 14 are dimensionally sized, they are then transferred to a saw operator where a cut-off saw sizes the part to its final sized length or to an intermediate sized length. If very accurate fine sized lengths are required, the intermediate sized lengths parts may be further sized to final size length by a variety of means such as milling, computer numerical controlled (CNC) machining, or grinding. Final sized lengths are deburred using vibratory tumbling, hand deburring or semi-automatic brush-a-lon deburring equipment.

In alternative embodiments of the method of the invention, other advantageous features of the heat sink 10, such as flat mounting surfaces, slots, drilled & tapped holes, etc. manufactured by the steps of the invention, may be incorporated by use of secondary operations, typically milling, CNC machining, turning or piercing to complete each part to its final specifications. These are conventional steps that can be implemented within the contemplation of the invention.

Referring to FIGS. 9–12, prior to applying a bonding layer (described below), to bond the first base element 12 to the bridging element 14 and to the second base element 16, an alternative intervening step may be instituted. We prefer including the step of cross cutting the first and second base elements 12, 16 and bridging element 14 so as to form a plurality of substantially rectangular shaped first pin fins 20, rectangular shaped second pin fins 38 and rectangular shaped third and fourth pin fins 26, 32. Cross cutting is typically performed by milling or use of a keyway cutters so as to form a plurality of substantially rectangular fins. Cross cutting enhances the heat transfer from fins 20, 26, 32, 38 into the air by breaking up the boundary layers that form along the surface of said fins 20, 26, 32, 38.

Referring to FIGS. 1–2, the common first face 18 of the first base element 12 is aligned with the common third face 24 of the bridging element 14, while the common fourth face 30 of the bridging element 14 is aligned with the common second face 36 of the second base element. In this way, first fins 20 of first base element 12 are aligned for being pressed into the third recess channels 28 in opposed third bridge element 14, while the fourth fins 32 of bridge element 14 are aligned for being pressed into the second recess channels 40 in opposed second base element 16. Likewise, each of the third fins 26 of bridge element 14 is aligned with and inserted in one of the first recesses 22 of first base element 12 while each of the second fins 38 of second base element 16 is aligned with and inserted in one of the fourth recesses 34 of bridging element 14.

Precise alignment of the first and second base elements 12, 16 with respect to the bridging element 14 for assembly includes locating and orienting either of the first and second base elements 12, 16 relative to an opposed common face of the bridging element 14. In this manner first and second tiers 41, 43 (described above) of heat sink 10 are formed. Skilled artisans will appreciate that alignment of the first and second base elements 12, 16 and bridging element 14 prior to assembly can be accomplished through various ways, such as with dowel pins and bushings in a fixture. Moreover, those skilled in the art will further appreciate that alignment can be achieved through automatic or manual manipulation of the first and second base elements 12, 16 and bridging element 14.

Once the first and second base elements 12, 16 and bridging element 14 are aligned, as discussed above, they are bonded together with a bonding layer 50 in FIG. 3, preferably by applying an epoxy resin to either the top portions of fins 20, 26, 32, 38 and the recess channels 22, 28, 34, 40. This process may be accomplished either automatically or manually using calibrated and precise dispensing devices. We prefer automatic dispensing in the interest of reduced cycle time and cost. Moreover, although any suitable bonding material may be used, we prefer using an epoxy resin having the highest thermally conductive rating available that sets up in a reasonable time span, such as the thermally conductive Epoxy Adhesive made by Thermalloy, Inc.

Figure 8:
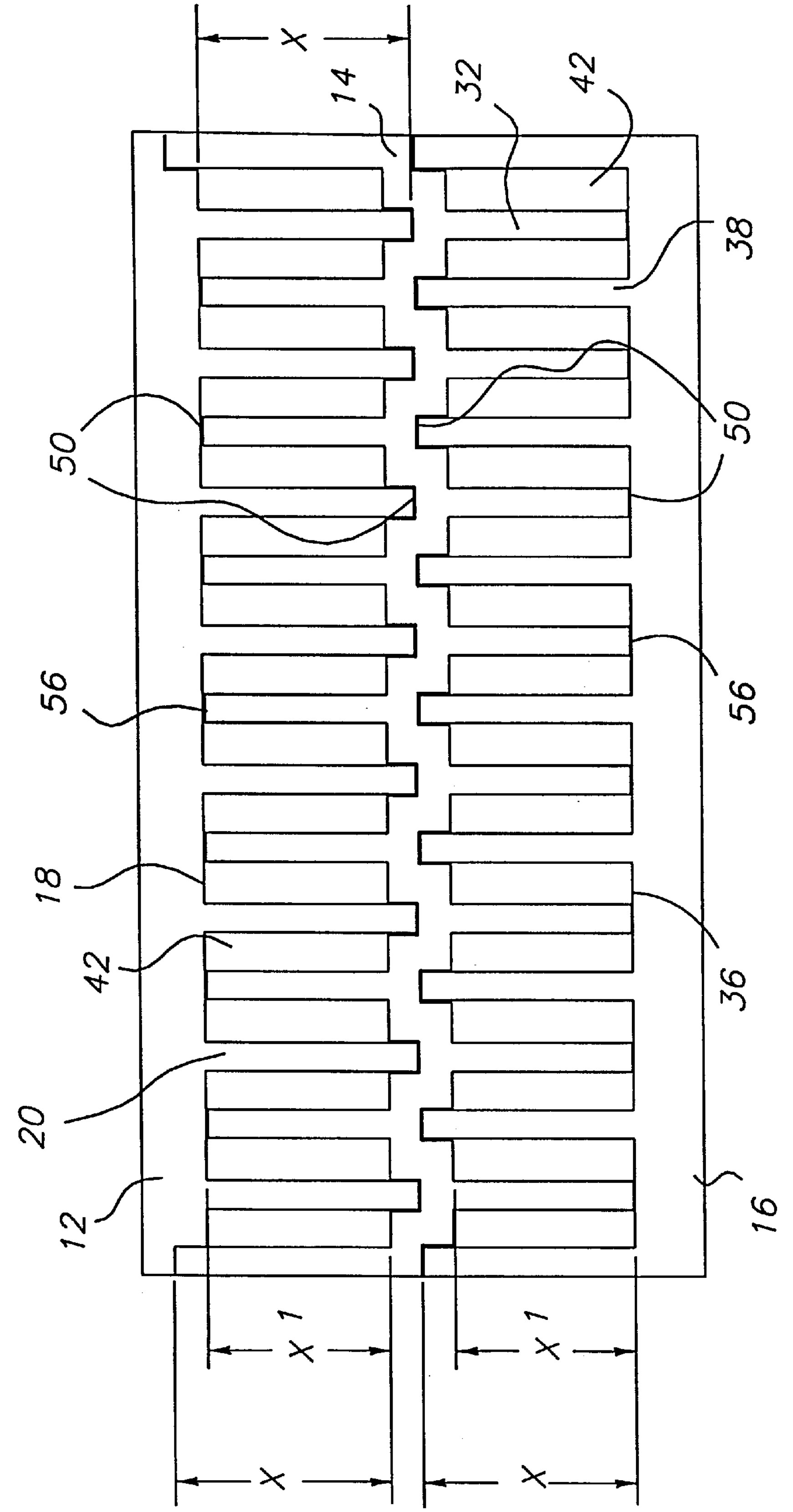
FIG. 8 is a front view of an alternative heat sink embodiment manufactured using the steps of the invention having some fins that abut the opposing faces of the opposing elements.
Figure 9:
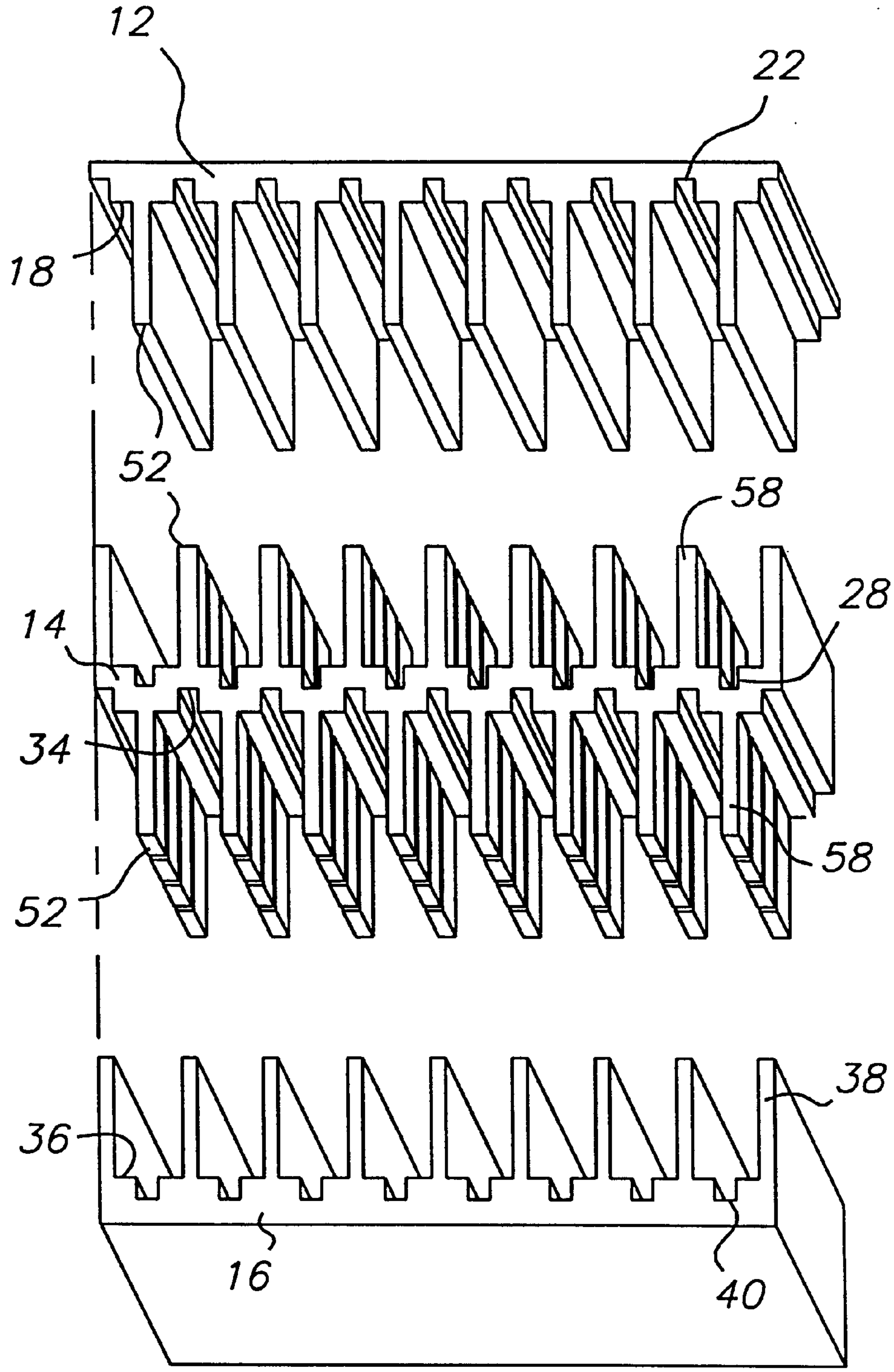
FIGS. 9 and 10 are exploded perspective views (from different orientations) of a heat sink made in accordance with the steps of the invention having cross cut second and third fins.
Figure 10:
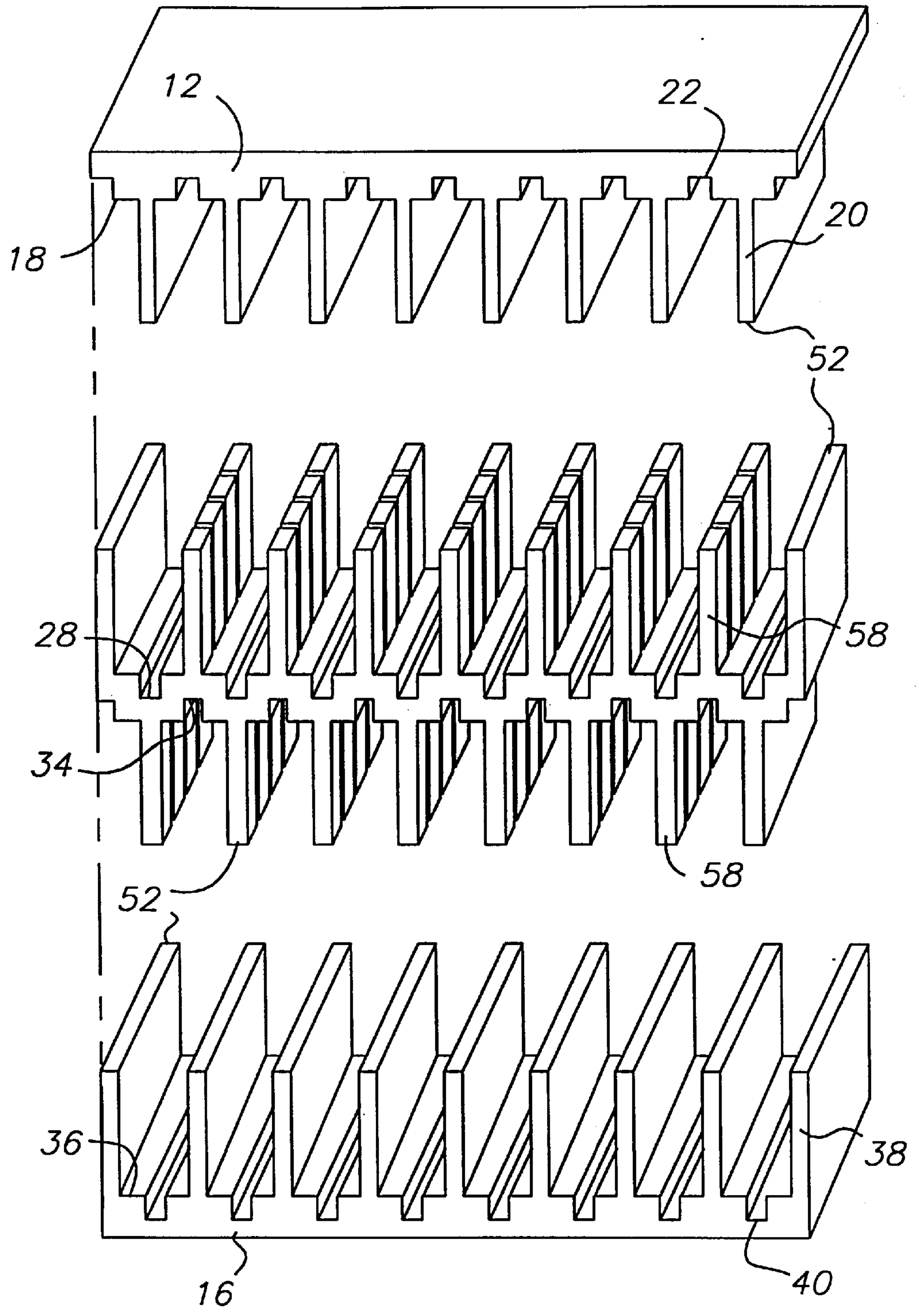
Figure 11:
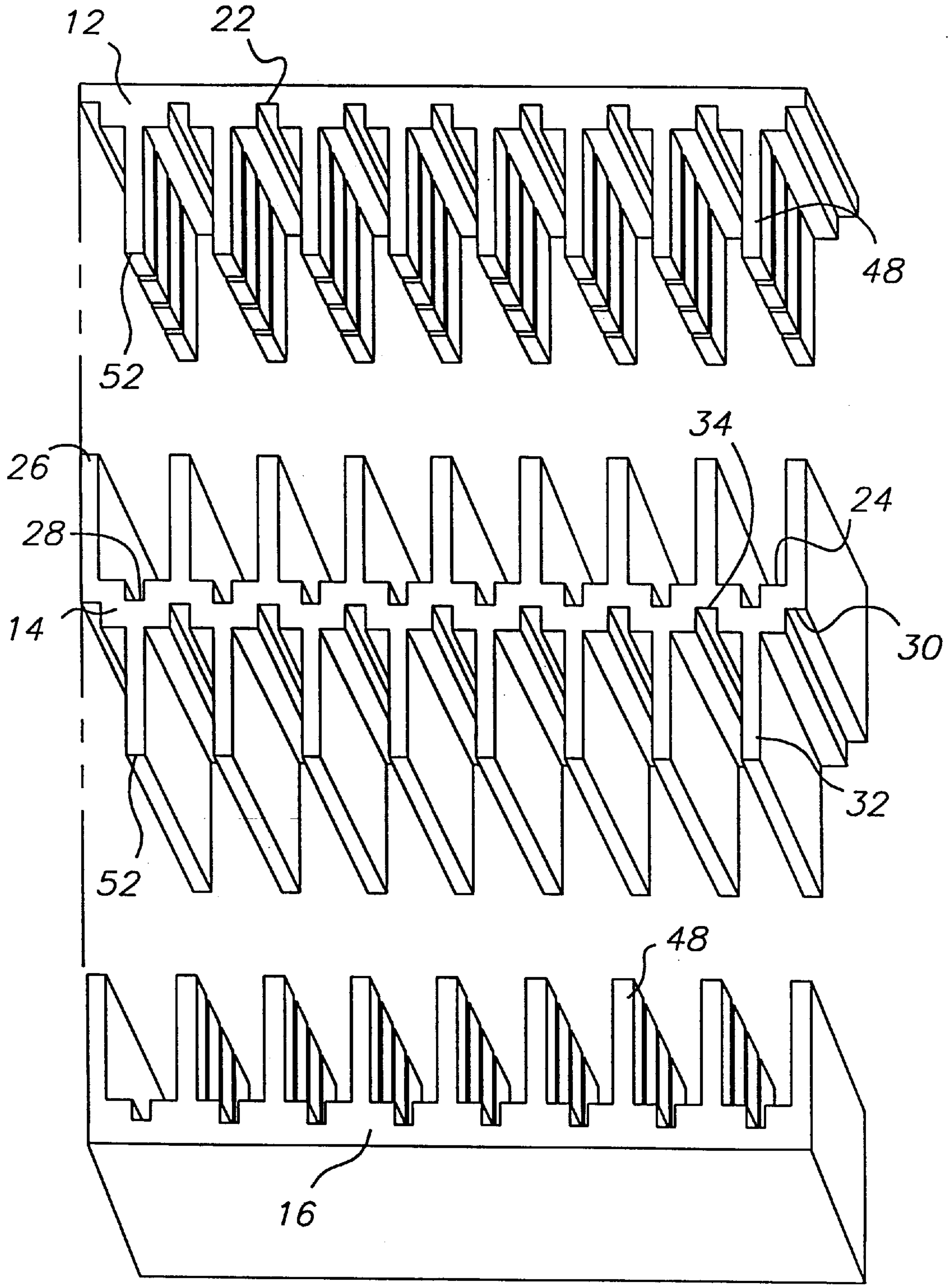
FIGS. 11 and 12 are exploded views (from different orientations) illustrating only the plurality of first and fourth fins being cross cut and air flow shields formed by the two outermost of the plurality of second and fourth fins; and, FIG. 13 is a front view of the heat sink elements shown in FIGS. 9–12.
Figure 12:
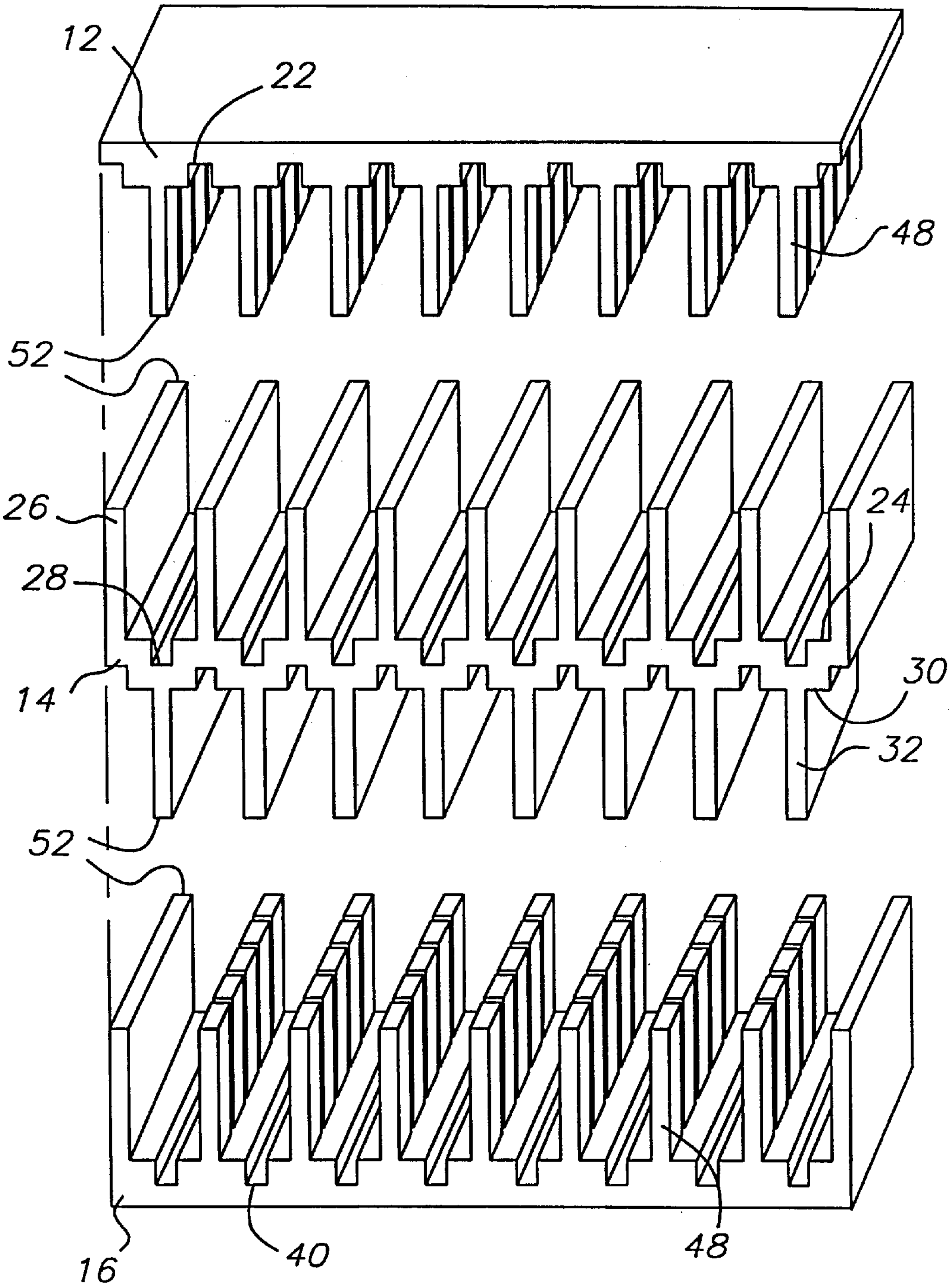
Figure 13:
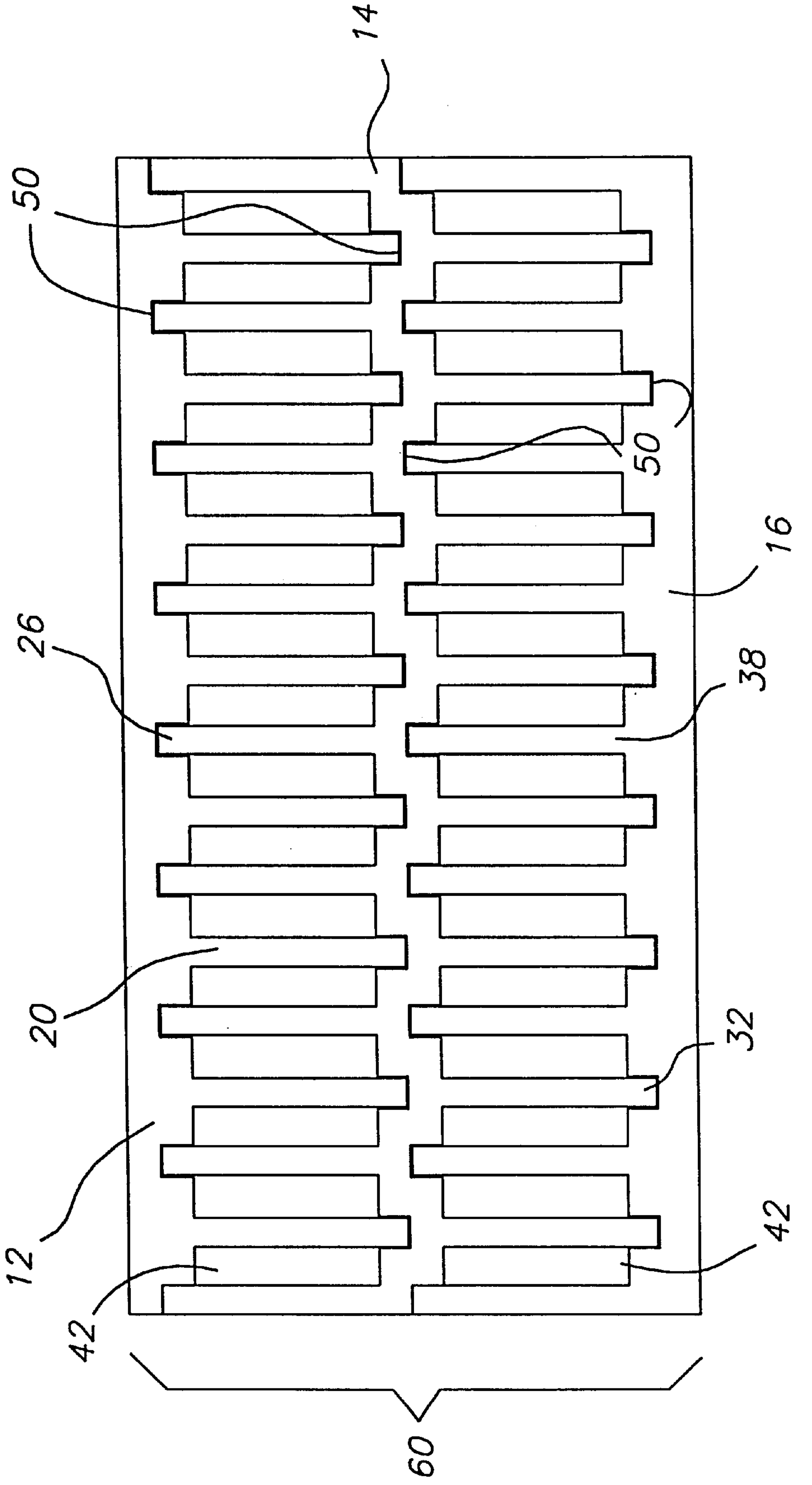

While the thickness of the bonding layer and the application procedure is not critical to the invention, we followed the principle that it is desirable to produce an assembly that is economical to manufacture. Thus, we preferred applying the epoxy resin only on the top end portions or tips 52 of the fins 20, 26, 32, 38 to accommodate ease of assembly. Referring to FIG. 2, this bonding practice was followed whether it was preferable to bond the first, second, third and fourth fins 20, 38, 26, 32 in opposing recesses 28, 34, 22, 40 (as discussed above) or, alternately, to bond the fins having length (x') against a planar portion of an opposing common face, as shown in FIG. 8.

Referring again to FIG. 2 the bonding resin has a chance to dry, the first, second, third and fourth fins 20, 38, 26, 32 are firmly pressed into an aligned respective first, second, third and fourth recess channels 8, 34, 22, 40. This practice facilitates the bonding process and provides more bonding strength between the first and second base elements 12, 16 and bridging element 14.

As the first and second base elements 12, 16 and bridging element 14 are assembled, pressure may be applied to the opposing first and second base elements 12, 16 and bridging element 14 which would urge into precise alignment any of the first, second, third and fourth fins 20, 38, 26, 32 which may not be properly aligned. This is done through the self-aligning chamfered ends 44 provided on the tip of the fins 20, 38, 26, 32 and the self aligning chamfered recesses 46.

Figure 5:
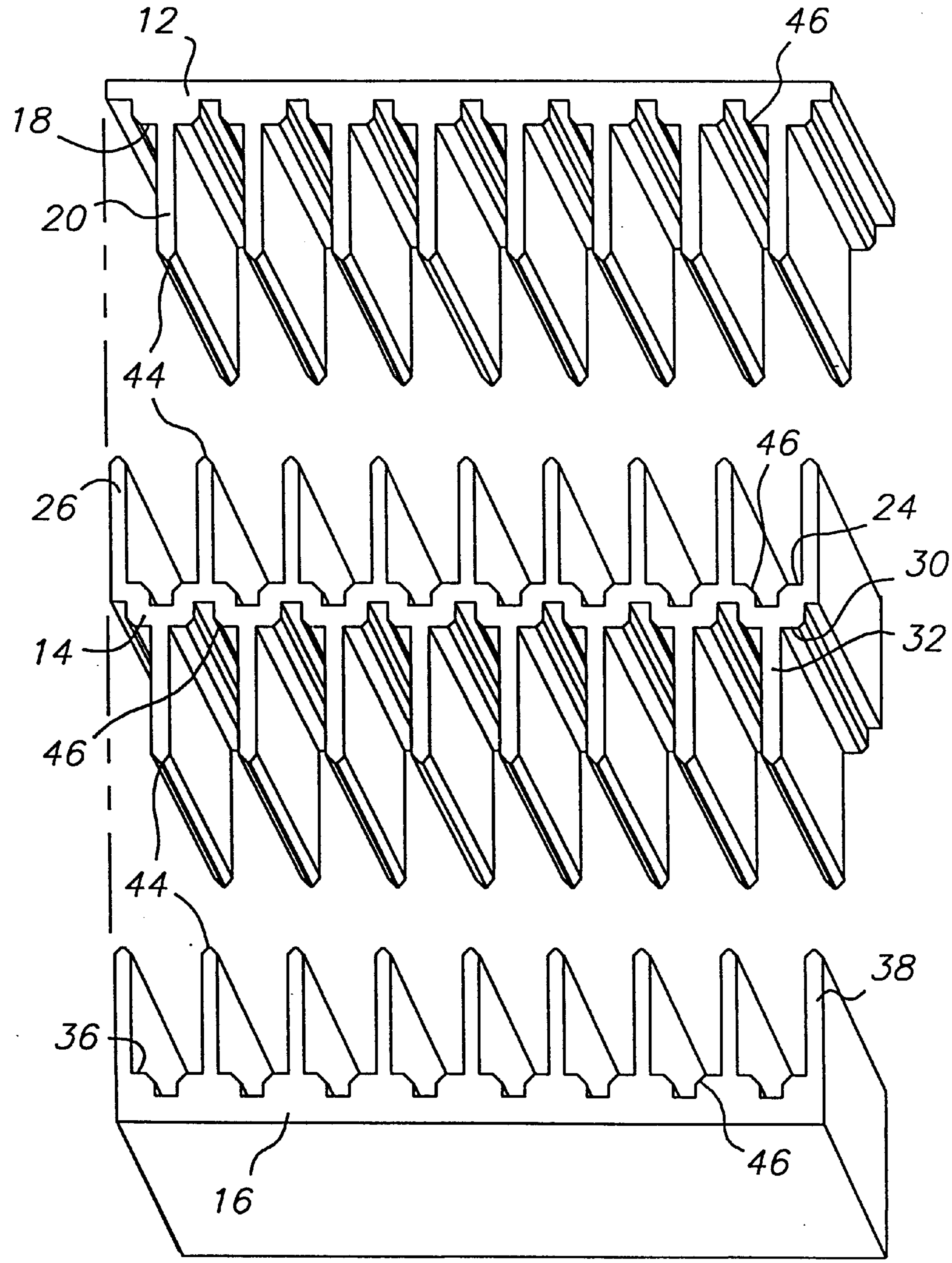
FIGS. 5 and 6 are exploded schematic views (from different orientations) of the heat sink manufactured in accordance with the steps of the invention illustrating the three extruded elements with chamfered recesses and chamfered fin tips, to assist guiding the elements during assembly.
Figure 6:
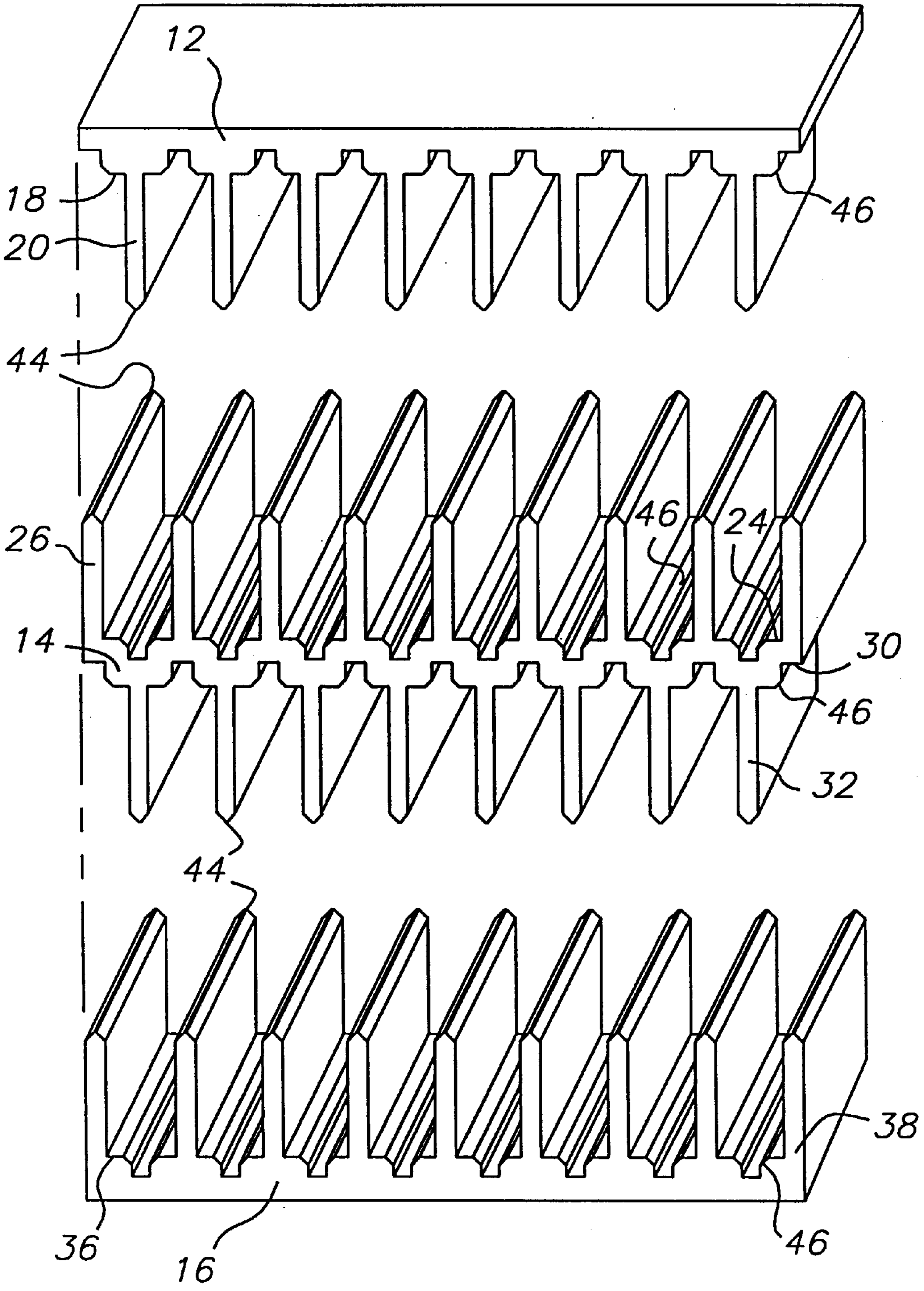
Figure 7:
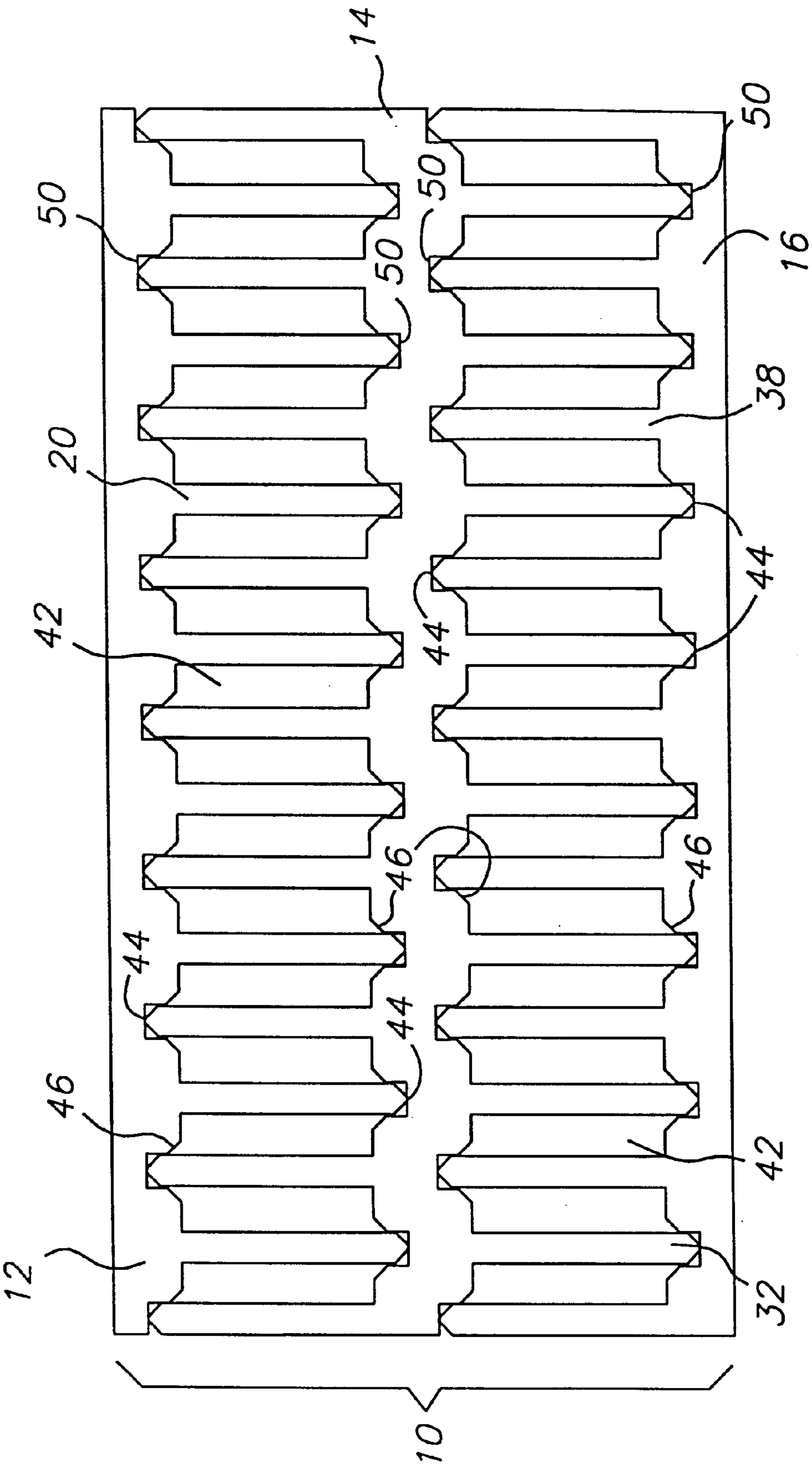
FIG. 7 is a front view of the heat sink elements showing the fins and chamfered recess channels that are used to position and bond the fins into the opposed element.

Depicted in FIG. 5, chamfered edges are preferably between 20 deg. and 30 deg. on each side to assure ease of entry of each of the fins 20, 38, 26, 32 into the opposed chamfered recesses 46. For low volume assembly the above could be done manually with a minimum of tooling.

Figure 4:
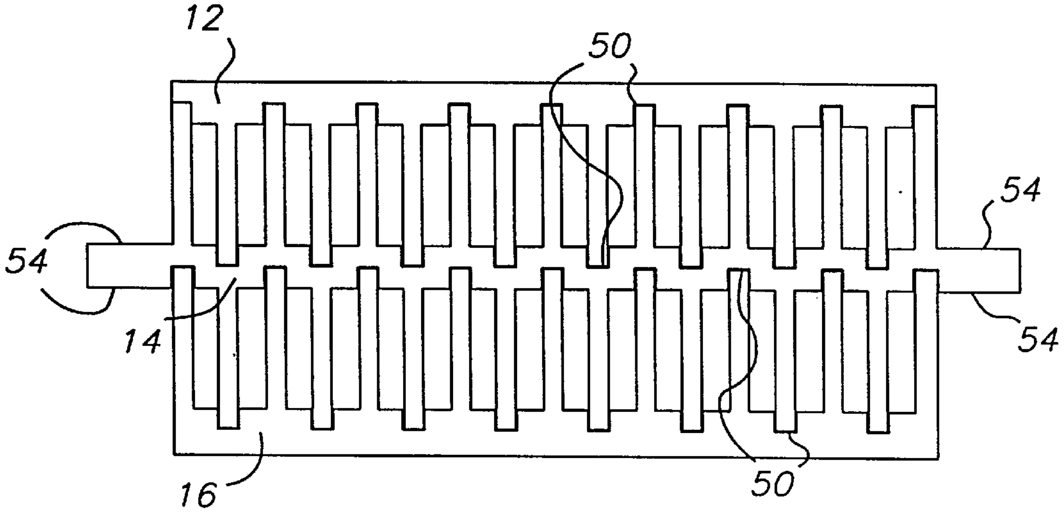
FIG. 4 is a front view of heat sink elements showing an alternative embodiment of FIG. 3 where the bridge element has lateral ends protruding for supporting independent elements.

In FIG. 4, an alternative embodiment of the heat sink assemble 10 has extensions or mounting platforms 54 on either end of the bridging element 14, in order to accommodate additional or multiple heat (or cooling) sources. For instance, one or more heat generating bodies, such as laser diodes (not shown), may be mounted on platforms 54 in thermal communication with the tiered heat sink 10.

While the invention has been described with a certain degree of particularity, it is manifest that many changes may be made in the details of construction and the arrangement of components without departing from the spirit and scope of this disclosure. It is understood that the invention is not limited to the embodiment set forth herein for purposes of exemplification, but is to be limited only by the scope of the attached claims, including the full range of equivalency to which each element thereof is entitled.

Parts List

10 . . . assembled heat sink
12 . . . first base element
14 . . . bridging element
16 . . . second base element
18 . . . common first face of first base element 12
20 . . . first fins of first base element 12
22 . . . first recess channels in first base element 12
24 . . . common third face of bridging element 14

26 . . . third fins of bridging element 14
28 . . . third recess channels in bridging element 14
30 . . . common fourth face of bridging element 14
32 . . . fourth fins of bridging element 14
34 . . . fourth recess channels in bridging element 14
36 . . . common second face of second base element 16
38 . . . second fins in second base element 16
40 . . . second recess channels in second base element 16
41 . . . first tier of heat sink 10
42 . . . fluid flow passageways
43 . . . second tier of heat sink 10
44 . . . chamfered ends of first, second, third and fourth fins
46 . . . chamfered recess channels in common first, second, third and fourth faces
48 . . . crosscut first and fourth fins
50 . . . bonding layer
52 . . . end edge portions of fins
54 . . . extended surfaces for mounting heat sources
56 . . . butt joint
58 . . . crosscut second and third fins
60 . . . assembled heatsink

What is claimed is:

1. An extruded, tiered high fin density heat sink, comprising:

an extruded first base element having a plurality of parallel first fins extending outwardly from a common first face with nearest adjacent first fins having a first recess formed therebetween in said common first face;

an extruded second base element having a plurality of parallel second fins extending outwardly from a common second face with nearest adjacent second fins having a second recess formed therebetween in said common second face;

an extruded bridging element having a third common face and an opposing fourth common face, wherein said third common face has a plurality of parallel third fins extending outwardly from said third common face with nearest adjacent third fins having a third recess formed therebetween in said common third face, and wherein said fourth common face has a plurality of parallel fourth fins extending outwardly from said fourth common face with nearest adjacent fourth fins having a fourth recess formed in said common fourth face; and wherein said common third and fourth faces of said bridging element have extending lateral ends which extend beyond outermost fins of any of said first and second base element and bridging element, said extending lateral ends adaptable for supporting independent elements, wherein said bridging element is arranged between said first and second base elements in a manner such that an end edge portion of each of said first fins is fixedly bonded in an opposing third recess in said bridging element and an end edge portion of each of said third fins is fixedly bonded in an opposing first recess of said first base element thereby forming a plurality of fluid passageways between said first and third fins, and wherein an end edge portion of each of said second fins of said second base elements is fixed in a fourth recess of said bridging element and an end edge portion each of said fourth fins of said common fourth face is fixedly bonded in a second recess of said second base element thereby forming a plurality of fluid passageways between said second and fourth fins.

* * * * *